United States Patent
Assefa et al.

(10) Patent No.: US 9,236,287 B2
(45) Date of Patent: Jan. 12, 2016

(54) FABRICATION OF LOCALIZED SOI ON LOCALIZED THICK BOX LATERAL EPITAXIAL REALIGNMENT OF DEPOSITED NON-CRYSTALLINE FILM ON BULK SEMICONDUCTOR SUBSTRATES FOR PHOTONICS DEVICE INTEGRATION

(71) Applicant: GLOBALFOUNDRIES INC., Grand Cayman (KY)

(72) Inventors: Solomon Assefa, Ossining, NY (US); William M. Green, Astoria, NY (US); Marwan H. Khater, Astoria, NY (US); Yurii A. Vlasov, Katonah, NY (US)

(73) Assignee: GLOBALFOUNDIES INC., Grand Cayman (KY)

( * ) Notice: Subject to any disclaimer, the term of this patent is extended or adjusted under 35 U.S.C. 154(b) by 34 days.

(21) Appl. No.: 13/667,389

(22) Filed: Nov. 2, 2012

(65) Prior Publication Data
US 2014/0127877 A1 May 8, 2014

(51) Int. Cl.
*H01L 21/762* (2006.01)

(52) U.S. Cl.
CPC ............................. *H01L 21/76205* (2013.01)

(58) Field of Classification Search
CPC .............. H01L 21/762; H01L 21/6232; H01L 21/76224; H01L 21/31056; H01L 21/76232; H01L 21/76243; H01L 21/76267; H01L 21/02532; H01L 21/02647; H01L 21/02639; H01L 21/0262; H01L 21/02661
See application file for complete search history.

(56) References Cited

U.S. PATENT DOCUMENTS

| 5,229,318 | A | 7/1993 | Straboni et al. |
| 6,407,005 | B2 | 6/2002 | Weon |
| 2005/0255649 | A1 | 11/2005 | Augusto et al. |
| 2008/0029840 | A1* | 2/2008 | Forbes et al. .................. 257/506 |
| 2008/0194075 | A1* | 8/2008 | Wu ................................ 438/425 |
| 2008/0203484 | A1* | 8/2008 | Hofmann et al. ............. 257/369 |
| 2009/0111200 | A1 | 4/2009 | Carothers et al. |
| 2010/0059822 | A1 | 3/2010 | Pinguet et al. |

(Continued)

OTHER PUBLICATIONS

Sherwood-Droz, et al., "Oxidized Silicon-on-Insulator (OxSOI) from Bulk Silicon: A New Photonic Platform," Optics Express 5786, Optical Society of America, Mar. 2010, vol. 18, No. 6, pp. 1-6.

(Continued)

*Primary Examiner* — Earl Taylor
*Assistant Examiner* — Mouloucoulaye Inoussa
(74) *Attorney, Agent, or Firm* — Scully, Scott, Murphy & Presser, P.C.

(57) ABSTRACT

Photonic SOI devices are formed by lateral epitaxy of a deposited non-crystalline semiconductor layer over a localized buried oxide created by a trench isolation process or by thermal oxidation. Specifically, and after forming a trench into a semiconductor substrate, the trench can be filled with an oxide by a deposition process or a thermal oxidation can be performed to form a localized buried oxide within the semiconductor substrate. In some embodiments, the oxide can be recessed to expose sidewall surfaces of the semiconductor substrate. Next, a non-crystalline semiconductor layer is formed and then a solid state crystallization is preformed which forms a localized semiconductor-on-insulator layer. During the solid state crystallization process portions of the non-crystalline semiconductor layer that are adjacent exposed sidewall surfaces of the substrate are crystallized.

12 Claims, 9 Drawing Sheets

(56) References Cited

U.S. PATENT DOCUMENTS

| | | | |
|---|---|---|---|
| 2010/0140708 A1 | 6/2010 | Hill et al. | |
| 2010/0258809 A1* | 10/2010 | Muller | 257/66 |
| 2011/0027950 A1 | 2/2011 | Jones et al. | |

OTHER PUBLICATIONS

Holzwarth, et al., "Localized Substrate Removal Technique Enabling Strong-Confinement Microphotonics in Bulk Si CMOS Processes," in Conference on Lasers and Electro-Optics/Quantum Electronics and Laser Science Conference and Photonic Applications Systems Technologies, OSA Technical Digest (CD), Optical Society of America, May 2008, pp. 1-2.

Ji, et al, "Bulk silicon photonic wire for one-chip integrated optical interconnection," Group IV Photonics (GFP), 2010 7th IEEE International Conference on Sep. 1-3, 2010, pp. 96-98.

Saenger, K. L., et al., "Mask-edge defects in hybrid orientation direct-Si-bonded substrates recrystallized by solid phase epitaxy after patterned amorphization", Journal of Applied Physics, Apr. 2007, 101, 084912.

Office Action dated Aug. 29, 2014 received in U.S. Appl. No. 13/667,384.

* cited by examiner

US 9,236,287 B2

FABRICATION OF LOCALIZED SOI ON LOCALIZED THICK BOX LATERAL EPITAXIAL REALIGNMENT OF DEPOSITED NON-CRYSTALLINE FILM ON BULK SEMICONDUCTOR SUBSTRATES FOR PHOTONICS DEVICE INTEGRATION

CROSS REFERENCE TO RELATED APPLICATION

The present invention is related to co-assigned U.S. patent application Ser. No. 13/667,384, filed on Nov. 2, 2012, the entire content and disclosure of which is incorporated herein by reference.

BACKGROUND

The present disclosure relates to methods of fabricating a localized semiconductor-on-insulator (SOI) on localized thick buried oxide (BOX) on a bulk semiconductor substrate for semiconductor photonic's device components, such as, for example, waveguides and modulators, integrated with bulk device technologies.

Photonic devices are useful as communication devices. Stand-alone photonic devices require an interface with optical fibers. A circuit including multiple photonic devices not only becomes bulky in size, but also economically disadvantageous. In order to fully utilize the functionalities of photonic devices, therefore, it is necessary to integrate photonic devices with other photonic devices and other types of devices such as semiconductor devices.

Integration of photonic devices with semiconductor devices such as complementary metal oxide semiconductor (CMOS) devices and/or bipolar complementary metal oxide semiconductor (BiCMOS) devices can provide on-chip and chip-to-chip optical interconnections. However, photonic devices and semiconductor devices can require different types of substrates. While many CMOS devices and BiCMOS devices require a bulk semiconductor substrate, many photonic devices require a semiconductor-on-insulator (SOI) substrate, which is more expensive than bulk substrates. Thus, there is a need to enable formation of such photonic devices and CMOS/BiCMOS devices on a same substrate in an economical manner.

SUMMARY

Photonic SOI devices are formed by lateral epitaxy of a deposited non-crystalline semiconductor layer over a localized buried oxide created by a trench isolation process or by thermal oxidation. Specifically, and after forming a trench into a semiconductor substrate, the trench can be filled with an oxide by a deposition process or a thermal oxidation can be performed to form a localized buried oxide within the semiconductor substrate. In some embodiments, the oxide can be recessed to expose sidewall surfaces of the semiconductor substrate. Next, a non-crystalline semiconductor layer is formed and then a solid state crystallization is preformed. During the solid state crystallization, process portions of the non-crystalline semiconductor layer that are adjacent the exposed sidewall surfaces of the semiconductor are crystallized to form a localized SOI layer.

In one embodiment of the present disclosure, a method of forming a semiconductor structure, i.e., a photonic device, is provided. The method of this embodiment of the present disclosure includes providing a patterned material stack having at least one opening on an upper surface of a semiconductor substrate. Next, at least one trench is formed within the semiconductor substrate utilizing the patterned material stack as an etch mask. The at least one trench and the at least one opening are then filled with an oxide. Next, a recessing step is employed to recess the oxide below the upper surface of the semiconductor substrate to expose sidewall surfaces of the semiconductor substrate within the at least one trench. A non-crystalline semiconductor layer is then formed atop the patterned material stack and within the at least one trench. In accordance with the present disclosure, at least one portion of the non-crystalline semiconductor layer directly contacts the exposed sidewalls of the semiconductor substrate. Solid state crystallization is then performed. In accordance with the present disclosure, the at least one portion of the non-crystalline semiconductor layer that directly contacts the exposed sidewalls of the semiconductor substrate is crystallized during solid state crystallization to form a localized SOI layer. Remaining non-crystalline semiconductor layer portions are then removed.

In another embodiment of the present disclosure, a second method of providing a photonic device is provided which includes providing a patterned material stack having at least one opening on an upper surface of a semiconductor substrate. Next, at least one trench is formed within the semiconductor substrate utilizing the patterned material stack as an etch mask. A sacrificial nitride-containing spacer is then formed on each exposed sidewall of the patterned material stack and the semiconductor substrate. In accordance with the present disclosure, a base of the sacrificial nitride-containing spacer is present on an exposed surface of the semiconductor substrate within a bottom portion of the at least one trench. The exposed portion of the semiconductor substrate at the bottom portion of the at least one trench is then subjected to oxidation. The oxidation forms a semiconductor oxide region within the semiconductor substrate at the bottom portion of the at least one trench. The sacrificial nitride-containing spacer is then removed to expose sidewall surfaces of the semiconductor substrate within the at least one trench. A non-crystalline semiconductor layer is then formed atop the patterned material stack and within the at least one trench. In accordance with the present disclosure, at least one portion of the non-crystalline semiconductor layer directly contacts the exposed sidewalls of the semiconductor substrate. Solid state crystallization is then performed. In accordance with the present disclosure, the at least one portion of the non-crystalline semiconductor layer that directly contacts the exposed sidewalls of the semiconductor substrate is crystallized during solid state crystallization to form a localized SOI layer. Remaining non-crystalline semiconductor layer portions are then removed.

DETAILED DESCRIPTION

The present disclosure, which provides methods for fabricating a localized SOI on a localized thick buried oxide (BOX) on a bulk semiconductor substrate for semiconductor photonic's device components, such as, for example, waveguides and modulators, integrated with bulk device technologies such as, for example, CMOS, BiCMOS and DRAM (dynamic random access memory, will now be described in greater detail by referring to the following discussion and drawings that accompany the present application. It is noted that the drawings that accompany the present application are provided for illustrative purposes only, and, as such, these drawings are not drawn to scale.

In the following description, numerous specific details are set forth, such as particular structures, components, materials, dimensions, processing steps and techniques, in order to provide a thorough understanding of the present disclosure. However, it will be appreciated by one of ordinary skill in the art that the various embodiments of the present disclosure may be practiced without these specific details. In other instances, well-known materials, structures or processing steps have not been described in detail in order to avoid obscuring the present disclosure.

Figure 1:
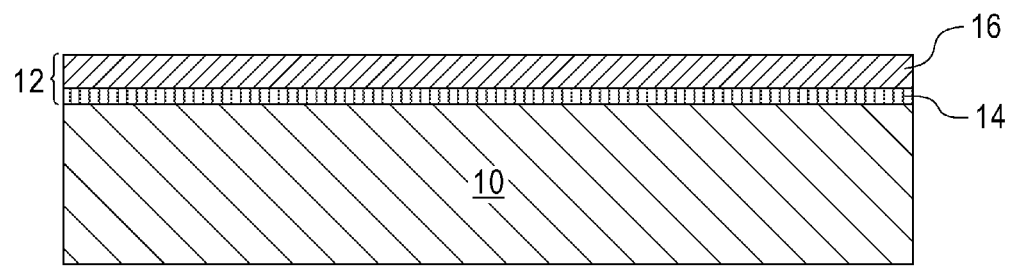
FIG. 1 is a vertical-cross sectional view illustrating a structure including a material stack of, from bottom to top, a pad oxide and an oxygen-impermeable layer located atop an upper surface of a semiconductor substrate in accordance with an embodiment of the present disclosure.

Reference is now made to FIGS. 1-14 which illustrate one embodiment of the present disclosure. Referring to FIG. 1, there is illustrated a structure that can be employed in one embodiment of the present disclosure. The structure includes a material stack 12 of, from bottom to top, a pad oxide 14 and an oxygen-impermeable layer 16 located atop an upper surface of a semiconductor substrate 10.

The semiconductor substrate 10 can be a bulk semiconductor substrate having only a semiconductor material between a planar uppermost surface and a planar bottommost surface. In one embodiment, the semiconductor substrate 10 can include a same single crystalline semiconductor material throughout the entirety thereof.

The semiconductor substrate 10 includes a semiconductor material, which can be an elemental semiconductor material such as silicon, germanium, and carbon, an alloy of at least two elemental semiconductor materials such as a silicon-germanium alloy, a III-V compound semiconductor material, a II-VI compound semiconductor material, or an alloy or a stack thereof. For example, the entirety of the semiconductor substrate 10 can be a single crystalline silicon layer, a single crystalline silicon-germanium alloy layer, a single crystalline silicon-carbon alloy layer, or a single crystalline silicon-germanium-carbon alloy layer.

In one embodiment, the semiconductor substrate 10 can be a bulk single crystalline semiconductor substrate including at least one doped or undoped semiconductor material throughout the entirety thereof. The semiconductor substrate 10 can be undoped, have a homogeneous doping of p-type or n-type, or can have a plurality of doped semiconductor portions having different dopant concentrations and/or different conductivity types (i.e., p-type or n-type). The thickness of the semiconductor substrate 10 can be from 50 micron to 2 cm, although lesser and greater thicknesses can also be employed. In one embodiment of the present disclosure the semiconductor substrate 10 is a bulk single crystalline silicon semiconductor substrate.

The pad oxide 14 of material stack 12 that is present atop the semiconductor substrate 10 can be a semiconductor oxide material such as, for example, silicon oxide. The pad oxide 14 can be formed as a blanket layer, i.e., a contiguous layer having a same thickness throughout and not including any holes therein, on the uppermost surface of the semiconductor substrate 10. The pad oxide 14 can be formed by a thermal oxidation in which the semiconductor substrate 10 is exposed to an oxidizing ambient such as $O_2$ or air, at a temperature of 900° C. or greater. During exposure, any upper portion of the semiconductor substrate 10 is converted into a semiconductor oxide. In some embodiments of the present disclosure, the pad oxide 14 can be formed by a deposition process such as, for example, chemical vapor deposition, and plasma enhanced chemical vapor deposition. The thickness of the pad oxide 14 can be from 4 nm to 10 nm, although lesser and greater thicknesses can also be employed.

The oxygen-impermeable layer 16 of material stack 12 can be formed as a blanket layer atop the blanket layer of pad oxide 14. As used herein, an "oxygen-impermeable" element is an element that is not permeable to oxygen. The oxygen-impermeable layer 16 includes at least an oxygen-impermeable material such as silicon nitride, a dielectric metallic nitride, or a conductive metallic nitride. In one embodiment, the oxygen-impermeable layer 16 includes silicon nitride. The oxygen-impermeable material of the oxygen-impermeable layer 16 can be in contact with the uppermost surface of the pad oxide 14.

In some embodiments of the present disclosure, the oxygen-impermeable layer 16 can further include an additional dielectric material layer in an upper portion thereof. The additional dielectric material layer that may be used can include, for example, undoped silicon oxide or doped silicon oxide.

The oxygen-impermeable layer 16 can be deposited, for example, by chemical vapor deposition (CVD) or atomic layer deposition (ALD). The thickness of the oxygen-impermeable layer 16 can be from 5 nm to 1,000 nm, although lesser and greater thicknesses can also be employed.

Figure 2:
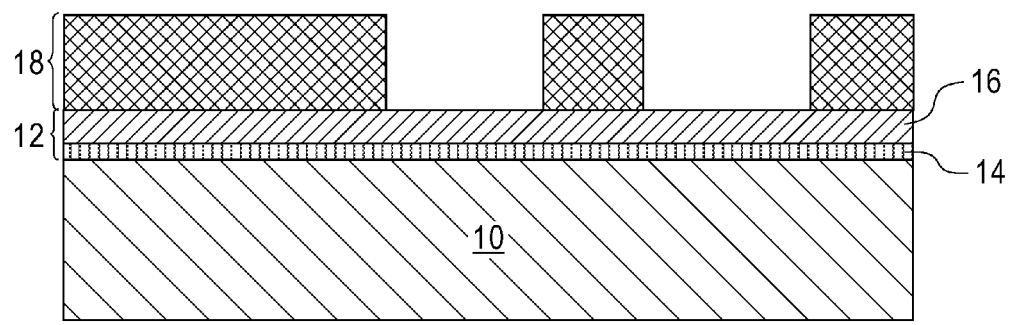
FIG. 2 is a vertical-cross sectional view illustrating the structure of FIG. 1 after forming a patterned photoresist atop the oxygen-impermeable layer.

Referring now to FIG. 2, there is illustrated the structure of FIG. 1 after forming a patterned photoresist 18 atop the oxygen-impermeable layer 16 or material stack 12. The patterned photoresist 18 can be formed by first applying a photoresist material atop the oxygen-impermeable layer 16, and then subjecting the photoresist material to lithography which includes exposing the photoresist material to a desired pattern of radiation and developing the resist utilizing a conventional resist developer.

Figure 3:
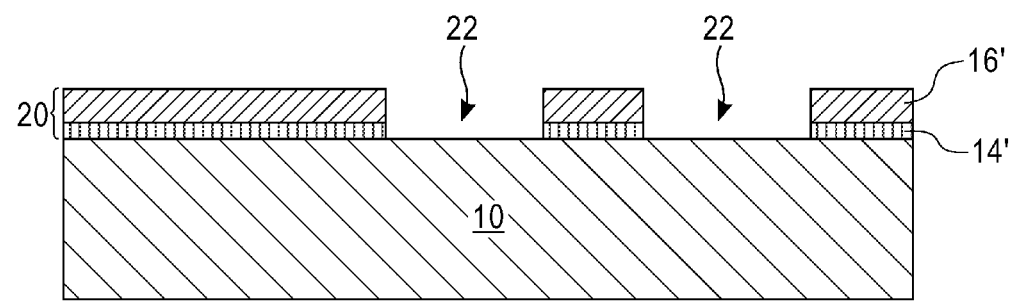
FIG. 3 is a vertical-cross sectional view illustrating the structure of FIG. 2 after transferring the pattern from the patterned photoresist into the oxygen-impermeable layer and pad oxide and stripping the patterned photoresist forming a patterned material stack atop the semiconductor substrate.

Referring to FIG. 3, there is illustrated the structure of FIG. 2 after transferring the pattern from the patterned photoresist 18 into the oxygen-impermeable layer 16 and pad oxide 14 and then stripping the patterned photoresist 18 so as to provide a patterned material stack 20 atop the semiconductor substrate 10. The transferring of the pattern from the patterned photoresist 18 into the oxygen-impermeable layer 16 and pad oxide 14 can be performed utilizing one or more etching steps. In one embodiment, a dry etch process such as, for example, reactive-ion etching, ion beam etching and/or laser etching can be employed in pattern transfer. In another embodiment, a chemical wet etch can be employed in pattern transfer. In yet another embodiment, a combination of a dry etch and a chemical wet etch can be used.

The patterned material stack 20 includes remaining portions of the oxygen-impermeable layer 16' and remaining portions of the pad oxide 14'. The patterned material stack 20 also includes at least one (herein after just "the opening") opening 22 which exposes a portion of the upper surface of the semiconductor substrate 10. The opening 22 in the patterned material stack 20 can be formed in the pattern of a line cavity, i.e., a cavity having a greater dimension along a lengthwise direction than along a widthwise dimension. The vertical cross-sectional view of FIG. 3 is along the widthwise direction of parallel line cavities. In one embodiment, some of the line cavities can be parallel to one another.

The patterned photoresist 18 can be removed after a portion of the upper surface of the semiconductor substrate 10 is physically exposed at the bottom of the opening 22. The removal of the patterned photoresist 18 from the structure can be achieved utilizing a conventional resist stripping process such as, for example, ashing.

Figure 4:
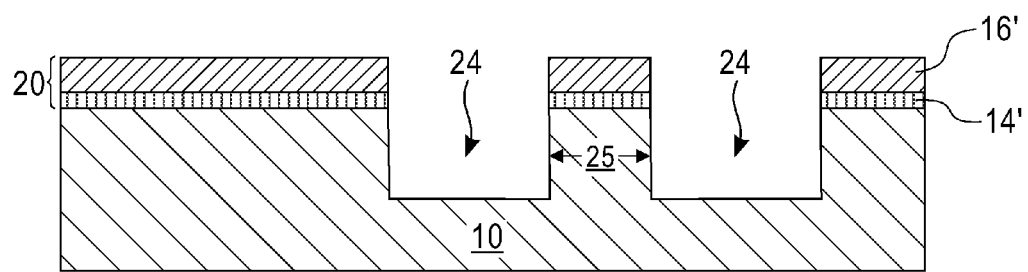
FIG. 4 is a vertical-cross sectional view illustrating the structure of FIG. 3 after forming a trench within the semiconductor substrate using the patterned material stack as an etch mask.

Referring to FIG. 4, there is illustrated the structure of FIG. 3 after forming at least one trench (hereinafter just "the trench") 24 within the semiconductor substrate 10 using the patterned material stack 20 as an etch mask. That is, FIG. 4 shows the resultant structure that is formed after transferring the pattern of the opening 22 into an upper portion of the semiconductor substrate 10. In one embodiment, the trench 24 is formed by an isotropic etch. The anisotropic etch etches the semiconductor material of the semiconductor substrate 10 selective to the material of the patterned material stack 20.

The trench 24 that is formed into the upper portion of the semiconductor substrate 10 replicates the pattern of the opening 22 that is present in the patterned material stack 20. In one embodiment, the trench 24 can be a line trench. Each trench 24 has a depth d as measured from the uppermost surface of the semiconductor substrate 10 to the bottommost surface of the trench 24.

In one embodiment, a first trench and a second trench are laterally separated by a lateral distance ld through the patterned material stack 20 and the upper portion of the semiconductor substrate 10. A portion of the semiconductor substrate 10 between these two trenches has a width, which is the lateral distance ld between two trenches 24. This portion of the semiconductor substrate 10 is herein referred to as a laterally isolated semiconductor material portion 25. In one embodiment, the lateral distance ld, i.e., the width of the laterally isolated semiconductor material portion 25, is less than the depth d of the two trenches 24. Each of the two trenches 24 laterally separates the laterally isolated semiconductor material portion 25 from the rest of the semiconductor substrate 10.

Each trench 24 can have a same first width w1, or a different first width w1 that varies from one trench to another trench. The first width w1 of each trench 24 can be, for example, in a range from 50 nm to 5,000 nm.

Figure 5:
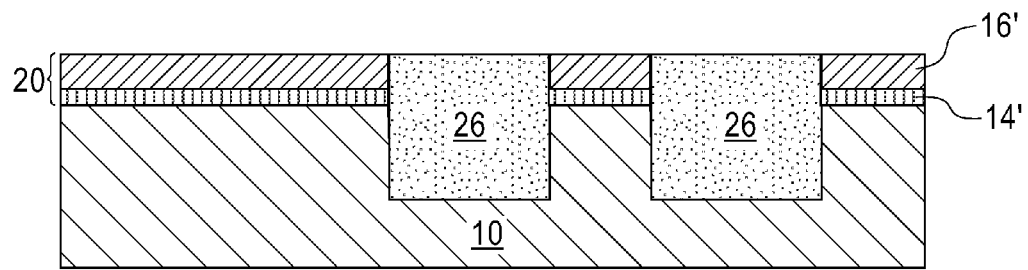
FIG. 5 is a vertical-cross sectional view illustrating the structure of FIG. 4 after filling the trench with an oxide and performing planarization.

Referring now to FIG. 5, there is illustrated the structure of FIG. 4 after filling each trench 24 and opening 22 with an oxide 26 and performing planarization. In one embodiment, the oxide 26 that is formed into the trench 24 and opening 22 can include a semiconductor oxide which includes a same semiconductor element(s) as the semiconductor material 10. In another embodiment, the oxide 26 can include a semiconductor oxide which includes at least one different semiconductor element as that of the semiconductor substrate 10. Typically, the oxide 26 that is formed in the trench 24 and opening 22 is silicon oxide. The oxide 26 can be formed utilizing a deposition process such as, for example, chemical vapor deposition (CVD). Excess oxide outside the opening 22 and above the uppermost surface of the patterned material stack 20 can be removed by planarization. In one embodiment, the planarization process may include chemical mechanical polishing.

Figure 6:
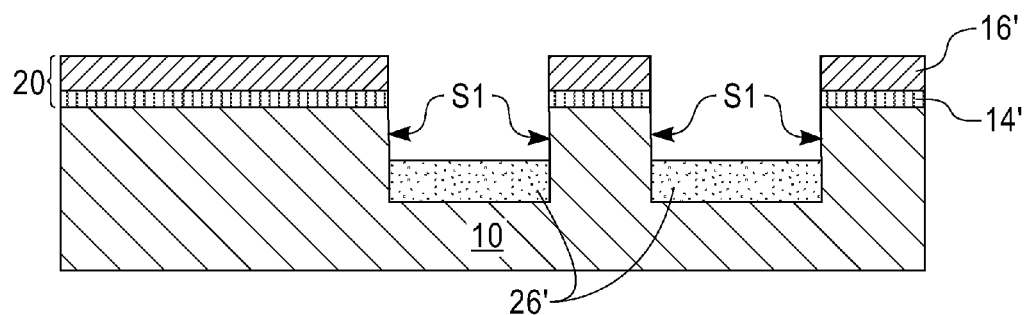
FIG. 6 is a vertical-cross sectional view illustrating the structure of FIG. 5 after recessing the oxide that was formed in the trench below the uppermost surface of the semiconductor substrate.

Referring to FIG. 6, there is illustrated the structure of FIG. 5 after recessing the oxide 26 such that the remaining oxide 26' with within the trench 24 is below the upper surface of the semiconductor substrate 10. The remaining oxide 26' within each trench 24 will subsequently become a buried oxide (BOX) of the structure. In one embodiment, the oxide 26 can be recessed utilizing a timed controlled reactive ion etching process. The remaining oxide 26' has a thickness which is sufficient to keep light trapped within a SOI layer to be subsequently formed. Typically, the remaining oxide 26' has a thickness from 1 micron to 3 microns. As shown, this recess exposed sidewall surfaces S1 of the semiconductor substrate 10.

Figure 7:
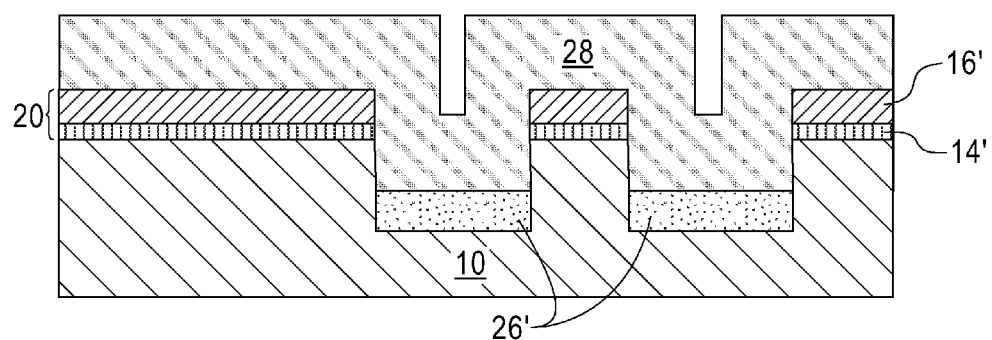
FIG. 7 is a vertical-cross sectional view illustrating the structure of FIG. 6 after forming a non-single crystalline semiconductor layer on an exposed surface of the patterned material stack and all exposed surfaces within the at least one trench.

Referring now to FIG. 7, there is illustrated the structure of FIG. 6 after forming a non-single crystalline semiconductor layer 28 on an exposed surface of the patterned material stack 20 and all exposed surfaces within the at least one trench 24, including atop an uppermost surface of remaining oxide 26' and sidewall surfaces S1 of the semiconductor substrate 10.

The term "non-single crystalline semiconductor" is defined as follows: The arrangement of atoms within a solid can range from a high degree of order in single crystalline material to a low degree of order in an amorphous material. A single crystalline material has a crystal lattice that is essentially continuous on a millimeter scale. In contrast, a non-single crystalline material can be defined as having short range atomic ordering associated with the various crystallites that make up the material. The crystallites are multiple, small regions of crystalline material dispersed throughout the non-single crystalline material. For example, a non-single crystalline material may have short range atomic ordering ranging in extent from 1 nanometer to about 100 microns. The crystallite dispersion may range from clusters or groups of individual crystallites to discrete individual crystallites.

In one embodiment of the present disclosure, the non-single crystalline semiconductor layer 28 is an amorphous semiconductor material, i.e., a semiconductor material that lacks the long-range order characteristic of a crystal. In another embodiment of the present disclosure, the non-single crystalline semiconductor layer 28 is a polycrystalline semiconductor material, i.e., a semiconductor material that is composed of many crystallites of varying size and orientation. The variation in direction can be random (called random texture) or directed, possibly due to growth and processing conditions.

Illustrative examples of semiconductor materials that can be used as the non-single crystalline semiconductor layer 28, include, but are not limited to, Si, Ge, SiGe, SiGeC, SiC, Ge alloys, GaSb, GaP, GaAs, InAs, InP, and all other III-V or II-VI compound semiconductors. In one embodiment, the semiconductor material used as the non-single crystalline semiconductor layer is the same as that of the semiconductor substrate 10. In another embodiment, the semiconductor material used as the non-single crystalline semiconductor layer is the same as that of the semiconductor substrate 10

Typically, the semiconductor material that is used as the non-single crystalline semiconductor layer 28 is silicon. When silicon is used as the semiconductor material of the non-single crystalline semiconductor layer 28, the non-single crystalline semiconductor layer 28 can be an amorphous silicon layer or a polycrystalline silicon layer.

The non-single crystalline semiconductor layer 28 can be formed by a conformal deposition such as, for example, chemical vapor deposition, plasma enhanced chemical vapor deposition or atomic layer deposition. By "conformal" it is meant that the deposition provides a film that defines a morphologically uneven interface with another body and has a thickness that is substantially the same (i.e., ±10 Angstroms) everywhere along the interface. The thickness of the non-single crystalline semiconductor layer 28 can be from 50 nm to 500 nm, although lesser and greater thicknesses can also be employed.

Figure 8:
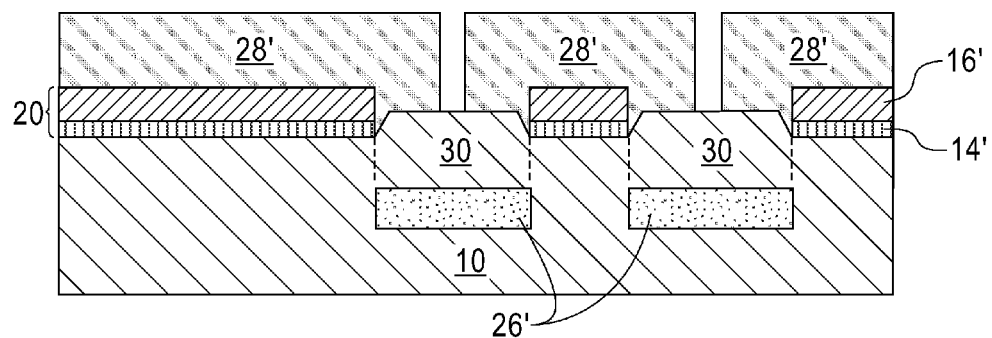
FIG. 8 is a vertical-cross sectional view illustrating the structure of FIG. 7 after performing solid state crystallization in which a bottom portion of said non-single crystalline semiconductor layer in contact with sidewall surfaces of the semiconductor substrate is converted into a crystalline semiconductor layer.

Referring now to FIG. 8, there is illustrated the structure of FIG. 7 after performing a solid state crystallization in which a bottom portion of the non-single crystalline semiconductor layer 28 in contact with the previously exposed sidewall surfaces S1 of the semiconductor substrate 10 is converted into a crystalline semiconductor layer 30; the exposed sidewall surfaces S1 of the semiconductor substrate 10 serve as a seed region for converting a portion of the non-single crystalline semiconductor layer 28 into crystalline semiconductor layer 30. During the solid state crystallization process, crystalline semiconductor material grows inward from the exposed sidewall surfaces of the semiconductor substrate 10 and after converging crystal grow occurs upward, i.e., in a direction away of oxide 26'. The crystalline semiconductor material layer 30 that forms during this step of the present disclose may be referred to herein as a photonic SOI layer. In the present drawings that accompanying the present disclosure, dotted lines are used to represent that no physical interface exists between the sidewall surfaces of the semiconductor substrate and the crystalline semiconductor layer that is formed by solid phase crystallization.

In FIG. 8, reference numeral 28' denotes remaining non-single crystalline semiconductor portions that were not crystallized during the solid state crystallization process. It is noted that portions of the non-single crystalline semiconductor layer 28 which are not in proximity to the exposed sidewall surfaces of the semiconductor substrate, such as those portions of the non-single crystalline semiconductor layer that are located atop the patterned material stack 18 are not crystallized during the solid state crystallization process.

The solid state crystallization process that is employed in the present disclosure can comprise a thermal anneal process. In one embodiment of the present disclosure, the thermal anneal is performed in an inert ambient such as, for example, helium, argon, neon and mixtures thereof. The temperature of the thermal anneal should be sufficient to 'catalyze' the formation of the crystalline semiconductor layer 30 at the exposed sidewall S1 of the semiconductor substrate 10. In one embodiment of the present disclosure, the thermal anneal is performed at a temperature from 500° C. to 1400° C. In another embodiment of the present disclosure, the thermal anneal is performed at a temperature from 900° C. to 1100° C.

The thickness of the crystalline semiconductor layer 30 that is formed during the solid state crystallization process varies depending on the conditions of the anneal annealing. In one embodiment of the present disclosure, the thickness of the crystalline semiconductor layer 30 that is formed during the solid state crystallization process is from 50 nm to 1000 nm.

Figure 9:
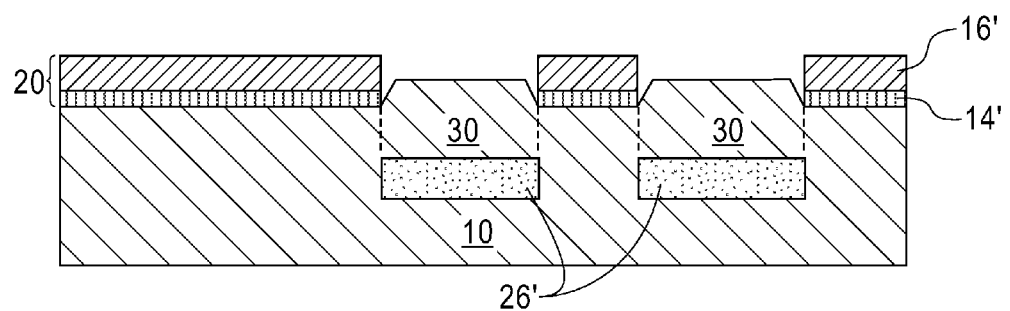
FIG. 9 is a vertical-cross sectional view illustrating the structure of FIG. 8 after removing remaining non-single crystalline semiconductor portions from atop the semiconductor substrate.

Referring now to FIG. 9, there is illustrated the structure of FIG. 8 after removing remaining non-single crystalline semiconductor portions 28' from atop the semiconductor substrate 10. In one embodiment of the present disclosure, a planarization process such as, for example, chemical mechanical polishing and/or grinding can be used to remove the non-single crystalline semiconductor portions 28' from atop the semiconductor substrate 10. In another embodiment, oxidation of the remaining non-single crystalline semiconductor portions 28' followed by an HF based wet etch can be used to remove the non-single crystalline semiconductor portions 28' from atop the semiconductor substrate 10. In yet another embodiment, a wet chemical etch can be used to remove the non-single crystalline semiconductor portions 28' from atop the semiconductor substrate 10. When such an embodiment is employed, the chemical etchant used may include, for example, $NH_4OH$.

Figure 10:
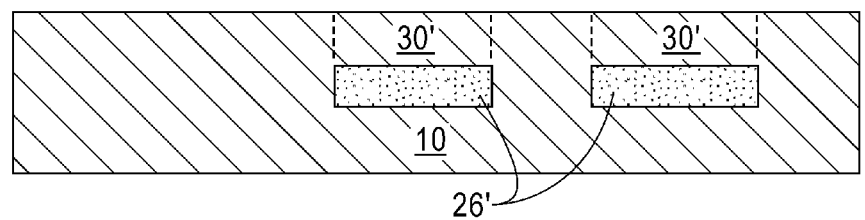
FIG. 10 is a vertical-cross sectional view illustrating the structure of FIG. 9 after removing the patterned material stack from atop the semiconductor substrate and performing a planarization process.

Referring now to FIG. 10, there is illustrated the structure of FIG. 9 after removing the patterned material stack 20 from atop the semiconductor substrate 10. Before, during, or after the removal of the patterned material stack 20 from the structure, a portion of the semiconductor material 30 that is located above the upper surface of semiconductor substrate 10 can be removed. The remaining portion of the crystalline semiconductor layer, which can also be referred to as a photonic SOI layer, is labeled as element 30' in FIG. 10.

In some embodiments of the present disclosure, the patterned material stack 20 and a portion of the crystalline semiconductor material layer 30 between adjacent patterned material stack portions can be removed in a single step utilizing, for example, planarization. The single step planarization process can include, for example, chemical mechanical polishing and/or grinding. In other embodiments, the patterned material stack 28 can be removed prior to removing the portion of the crystalline semiconductor material 30. In such an embodiment, one or more dry etching and/or chemical wet etching processes can be used to remove the patterned material stack 20, followed by chemical mechanical polishing which removes the portion of the crystalline semiconductor layer 30 that was previously located between adjacent patterned material stack portions.

The resultant structure illustrated, for example, in FIG. 10, is planar. That is, an uppermost surface of the photonic SOI layer 30' is coplanar to the upper surface of the semiconductor substrate 10. As shown, each photonic SOI layer 30' is positioned above the remaining oxide 26' that is left within each trench 22.

At this point of the present disclosure, bulk semiconductor devices such as, for example, complementary metal oxide semiconductor devices, i.e., transistors, can be formed. Although a transistor bulk semiconductor device is disclosed and illustrated, the present disclosure is not limited to only such a bulk semiconductor device. Instead, other bulk semiconductor devices such as, for example, a SiGe heterobipolar transistor and/or a dynamic random access memory (DRAM) can also be formed.

Figure 11:
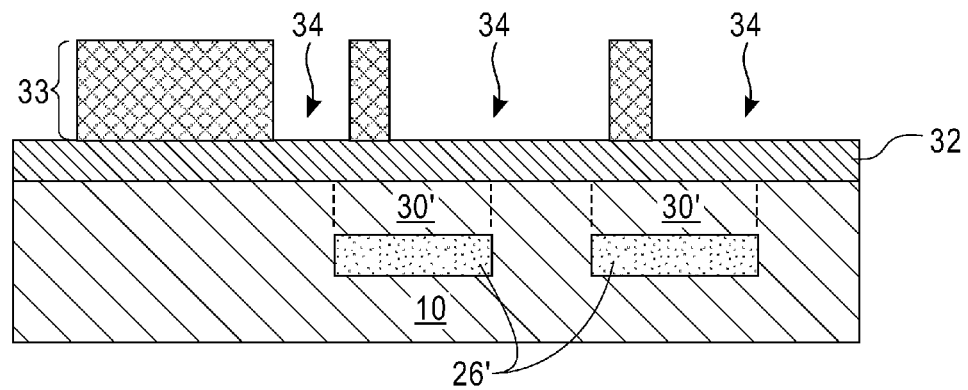
FIG. 11 is a vertical-cross sectional view illustrating the structure of FIG. 10 after formation of another oxygen-impermeable layer and another patterned photoresist atop the semiconductor substrate.

Referring first to FIG. 11, there is illustrated the structure of FIG. 10 after formation of another oxygen-impermeable layer 32 and another patterned photoresist 33 atop the semiconductor substrate 10. As shown, a bottommost surface of the oxygen-impermeable layer 32 directly contacts the upper surface of the photonic SOI layer 30' and the upper surface of the semiconductor substrate 10. Also, and as shown in FIG. 11, the another patterned photoresist 33 includes trench patterns 34 formed therein.

The another oxygen-impermeable layer 32 can include one of the materials mentioned above for the oxygen-impermeable layer 16. In one embodiment, the another oxygen-impermeable layer 32 comprises silicon nitride. The another oxygen-impermeable layer 32 that is employed in this embodiment of the present disclosure can be formed utilizing one of the deposition processes mentioned above for oxygen-impermeable layer 16. Also, the another oxygen-impermeable layer 32 can have a thickness within the range mentioned above for oxygen-impermeable layer 16.

The another patterned photoresist 33 can be formed by first applying a blanket layer of photoresist material to an exposed surface of the another oxygen-impermeable layer 32. Next, the blanket layer of photoresist material is patterned by lithography.

Figure 12:
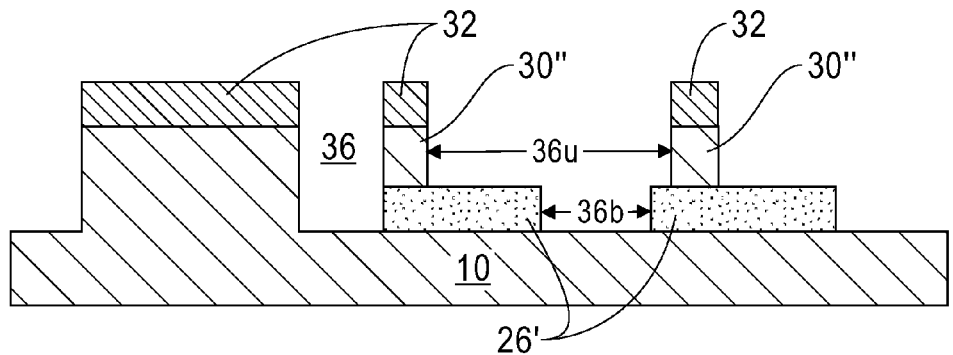
FIG. 12 is a vertical-cross sectional view illustrating the structure of FIG. 11 after formation of isolation trenches within the semiconductor substrate and stripping of the another patterned photoresist.

Referring to FIG. 12, there is illustrated the structure of FIG. 11 after formation of isolation trenches 36 within the semiconductor substrate 10 and stripping of the another patterned photoresist 33. The isolation trenches 36 can be formed by transferring the trench patterns 34 of the another patterned photoresist 33 into the another oxygen-impermeable layer 32 and then into the semiconductor substrate 10. In some instances, a portion of the photonic SOI layer 20' can also be removed during the pattern transfer process. The remaining photonic SOI layer, which is labeled as element 30" in FIG. 12, has a reduced width as compared to the width of the photonic SOI layer 30'. Also, the reduced width of the remaining photonic SOI layer 30" is less than the width of the remaining oxide 26'.

In accordance with an embodiment of the present disclosure, the transferring of the trench patterns 34 of the another patterned photoresist 33 can be performed utilizing an etching process such as, for example, reactive ion etching. In some embodiments, the trench patterns 34 can be transferred into the another oxygen-impermeable layer 32 utilizing a first etching process, then the another patterned photoresist 33 is removed by utilizing a conventional resist stripping process, such as, for example ashing, and thereafter, the trench pattern 36 formed into the another oxygen-impermeable layer 32 can be transferred into the semiconductor substrate 10 utilizing a second etching process that differs from the first etching process. In some instances, the another patterned photoresist 33 remains on the structure after the first etch, and is then removed from the structure following the second etch.

As shown, some of the isolation trenches 36 are of variable widths having for example, a bottom portion 36b of a first width, and an upper portion 36u of a second width, wherein the first width is less than the second width. The bottom portion 36b of isolation trenches 26 of variable widths have at least one sidewall defined by the remaining photonic SOI layer 30".

Figure 13:
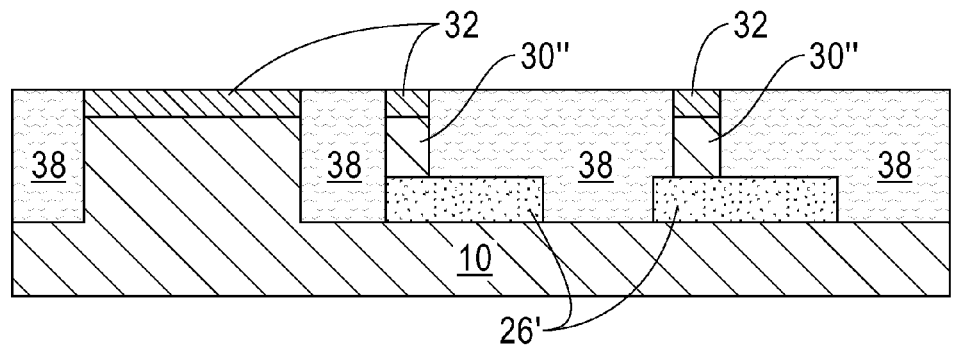
FIG. 13 is a vertical-cross sectional view illustrating the structure of FIG. 12 after filling the isolation trenches with a dielectric oxide and planarization.

Referring now to FIG. 13, there is illustrated the structure of FIG. 12 after filling the isolation trenches 36 with a dielectric oxide and planarization. The planarized and dielectric oxide filled trenches are herein referred to as isolation trenches 38.

The filling of the isolation trenches 36 with dielectric oxide may comprise any conventional deposition process such, as for example, chemical vapor deposition. The dielectric oxide can include any conventional oxide material including, for example, silicon oxide.

After filling of the isolation trenches 38 with the dielectric oxide, the structure is subjected to a planarization process such as, for example, chemical mechanical polishing and/or grinding. In the embodiment illustrated by FIG. 13, the planarization process stops on an uppermost surface of the another oxygen-impermeable layer 32.

At this point of the present disclosure, another planarization process can be performed to remove the remaining portions of the oxygen-impermeable layer 32, and thereafter bulk semiconductor devices such as, for example, complementary metal oxide semiconductor devices, i.e., transistors, can be formed. The structure that is formed after forming these bulk semiconductor devices is shown, for example, in FIG. 14.

Figure 14:
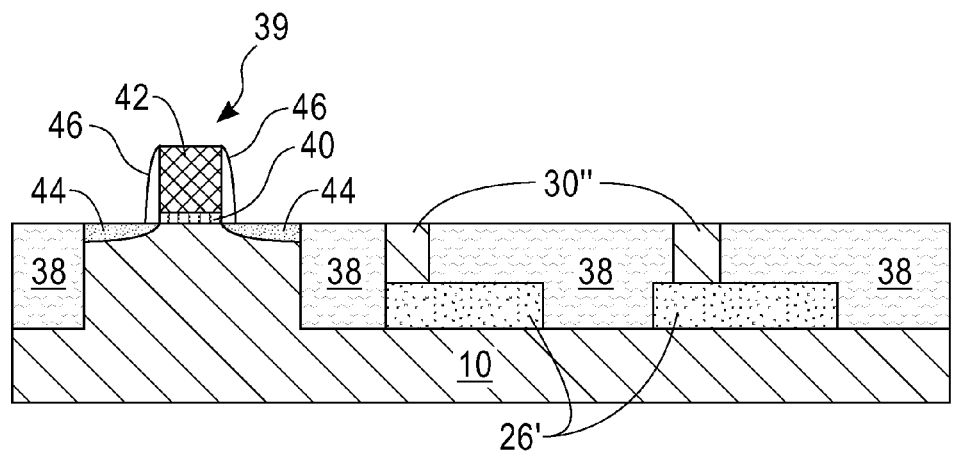
FIG. 14 is a vertical-cross sectional view illustrating the structure of FIG. 13 after formation of a bulk semiconductor device on an exposed semiconductor material portion of the semiconductor substrate.

Specifically, FIG. 14 illustrates the structure of FIG. 13 after formation of a bulk semiconductor device 39 on an exposed semiconductor material portion of the semiconductor substrate 10. In the illustrated embodiment, the transistor includes at least a gate dielectric 40 and a gate electrode 42 located on an exposed semiconductor surface of the semiconductor substrate 10. The transistor also includes a source region and a drain region collectively referred to herein as a source/drain regions 44 located within a semiconductor portion of the semiconductor substrate 10 and located at a footprint of the gate dielectric 40 and the gate electrode. 42. The transistor can also include a dielectric spacer 46 located on an exposed sidewall surface of at least the gate electrode 42.

The gate dielectric 40 can be comprised of a semiconductor oxide, semiconductor nitride, semiconductor oxynitride, or any multilayered stack thereof. In one embodiment, the gate dielectric 40 is comprised of a semiconductor oxide such as, for example, silicon oxide. The gate dielectric 40 can also be comprised of a dielectric metal oxide having a dielectric constant that is greater than the dielectric constant of silicon oxide, e.g., 3.9. In one embodiment, the gate dielectric 40 comprises a dielectric oxide having a dielectric constant greater than 4.0. In another embodiment, the gate dielectric 40 can be comprised of a dielectric oxide having a dielectric constant of greater than 8.0. Exemplary dielectric oxide materials which have a dielectric constant of greater than 3.9 include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In some embodiments, multilayered stacks of at least two of the above mentioned dielectric materials can be employed. For example the gate dielectric 40 can include stack of, from bottom to top, silicon oxide and a hafnium oxide.

The thickness of the gate dielectric 40 may vary depending on the technique used to form the same. Typically, and in one embodiment, the gate dielectric 40 has a thickness from 0.5 nm to 10 nm. In another embodiment, the gate dielectric 40 has a thickness from 1.0 nm to 5 nm. In yet other embodiments of the present disclosure, the gate dielectric 40 may have an effective oxide thickness on the order of, or less than, 2 nm.

The gate dielectric 40 can be formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes. Alternatively, the gate dielectric 40 can be formed utilizing a thermal process such as, for example thermal oxidation or thermal nitridation.

The gate electrode 42 can comprise any conductive metal-containing material including, but not limited to, doped polysilicon, doped SiGe, an elemental metal, (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayers thereof. In one embodiment, the gate electrode 42 is comprised of nFET metal. In another embodiment, the gate electrode 42 is comprised of a pFET metal. In a further embodiment, the gate electrode 42 is comprised of TiN. In some embodiments, the gate electrode 42 includes, from bottom to top, a conductive metal and doped polysilicon.

The gate electrode 42 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other like deposition processes. When a metal silicide is formed, a conventional silicidation process can be employed. When a Si-containing material is employed as the gate electrode 42, a non-doped Si-containing layer can be formed and thereafter introducing a dopant into the non-doped Si-containing layer by utilizing one of ion implantation, gas phase doping, or by transferring a dopant from a sacrificial material layer formed in proximity of the non-doped Si-containing layer, and then removing the sacrificial layer from the structure. Alternatively, a doped Si-containing layer can be formed utilizing an in-situ doping deposition process.

The transistor can be formed utilizing any conventional process including, for example, a gate first or a gate last, i.e., replacement gate process. So as not to obscure the present disclosure, the details of such processes are not described herein.

The source/drain regions 44 can be formed utilizing any conventional ion implantation process. The source/drain regions include n-type dopants or p-type dopants as is well known to one skilled in the art. The dielectric spacer 46 can be comprised of a dielectric oxide, such as for example, silicon oxide, and/or an oxygen-impermeable dielectric material such silicon nitride, or a dielectric metallic nitride. The dielectric spacer 46 can be formed by deposition, followed by etching.

Figure 15:
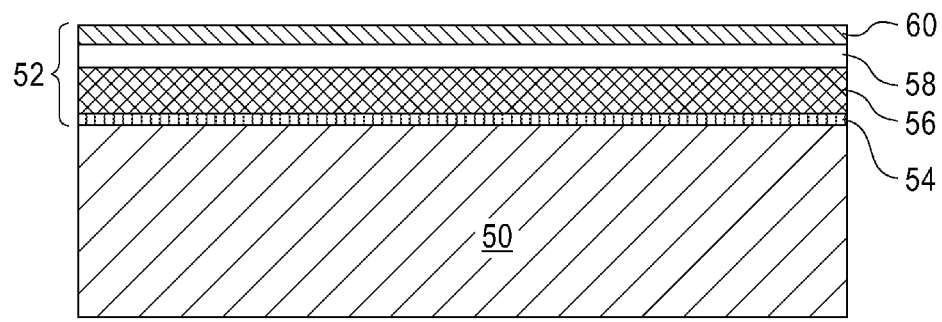
FIG. 15 is a vertical-cross sectional view illustrating a structure including a material stack located atop a semiconductor substrate that can be employed in another embodiment of the present disclosure.

Reference is now made to FIGS. 15-25 which illustrate a second embodiment of the present disclosure. The second embodiment of the present disclosure begins by first providing the structure shown, for example, in FIG. 15. Specifically, FIG. 15 illustrates a structure including a material stack 52 located atop a semiconductor substrate 50.

The semiconductor substrate 50 that is employed in this embodiment of the present disclosure is the same as semiconductor substrate 10 utilized in the first embodiment of the present disclosure. As such, the description for semiconductor substrate 10 can also be used herein to describe semiconductor substrate 50.

The material stack 52 includes, from bottom to top, a first pad oxide 54, a first oxygen-impermeable layer 56 located on an exposed surface of the first pad oxide 54, a second pad oxide 58 located on an exposed surface of the first oxygen-impermeable layer 56, and a second oxygen-impermeable layer 60 located on the second pad oxide 58.

In one embodiment, the first pad oxide 54 and the second pad oxide 58 may comprise a same pad oxide material. In another embodiment, the first pad oxide 54 and the second pad oxide 58 may comprise a different pad oxide material. Notwithstanding which embodiment is employed in the present disclosure, the first pad oxide 54 and the second pad oxide 58 can be comprised of a semiconductor oxide material such as described above for pad oxide 14. The first pad oxide 54 and the second pad oxide 58 can be formed utilizing one of the techniques mentioned above in forming the pad oxide 14. The first pad oxide 54 has a thickness which is typically less than the thickness of the second pad oxide 58.

In one embodiment, the first oxygen-impermeable layer 56 and the second oxygen-impermeable layer 60 may comprise a same material. In another embodiment, the first oxygen-impermeable layer 56 and the second oxygen-impermeable layer 60 may comprise a different material. Notwithstanding which embodiment is employed in the present disclosure, the first oxygen-impermeable layer 56 and the second oxygen-impermeable layer 60 can be comprised of one of the oxygen-impermeable materials mentioned above for oxygen-impermeable layer 16. The first oxygen-impermeable layer 56 and the second oxygen-permeable layer 60 can be formed utilizing one of the techniques mentioned above in forming the oxygen-impermeable layer 16.

Figure 16:
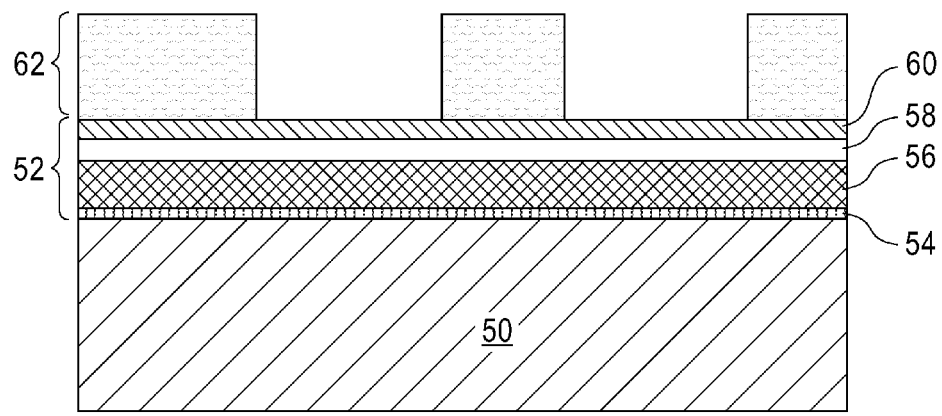
FIG. 16 is a vertical-cross sectional view illustrating the structure of FIG. 15 after forming a patterned photoresist atop the uppermost surface of the material stack.

Referring now to FIG. 16, there is illustrated the structure of FIG. 15 after forming a patterned photoresist 62 atop the uppermost surface of the material stack 52. The patterned photoresist 62 can be formed utilizing the same technique as mentioned above for forming patterned photoresist 18.

Figure 17:
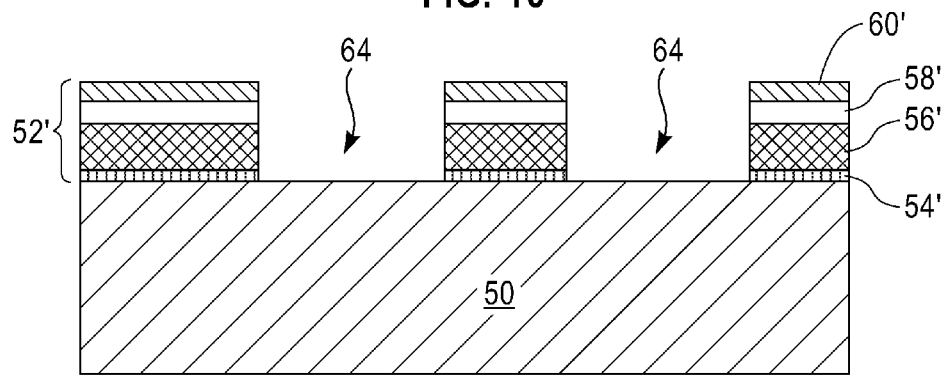
FIG. 17 is a vertical-cross sectional view illustrating the structure of FIG. 16 after transferring the pattern from the patterned photoresist into the material stack and stripping the patterned photoresist from the structure.

Referring now to FIG. 17, there is illustrated the structure of FIG. 15 after transferring the pattern from the patterned photoresist 62 into the material stack 52 and stripping the patterned photoresist 62 from the structure. The resultant structure now includes a patterned material stack 52' atop the semiconductor substrate 50. The transferring of the pattern from the patterned photoresist 62 into the material stack 52 can be performed utilizing one or more etching steps. In one embodiment, a dry etch process such as, for example, reactive-ion etching, ion beam etching and/or laser etching can be employed in pattern transfer. In another embodiment, a chemical wet etch can be employed in pattern transfer. In yet another embodiment, a combination of a dry etch and a chemical wet etch can be used.

The patterned material stack 52' includes remaining portions of the first and second oxygen-impermeable layers, labeled as elements 56' and 60' respectively, and remaining portions of the first and second pad oxides, labeled as 54' and 58', respectively. The patterned material stack 52' also includes an opening 64 which exposes portions of the semiconductor substrate 50. The opening 64 in the patterned material stack 52' can be formed in the pattern of a line cavity, i.e., a cavity having a greater dimension along a lengthwise direction that along a widthwise dimension. The vertical cross-sectional view of FIG. 17 is along the widthwise direction of parallel line cavities. In one embodiment, some of the line cavities can be parallel to one another.

The patterned photoresist 62 can be removed after an uppermost surface of the semiconductor substrate 50 is physically exposed at the bottom of the opening 64. The removal of the patterned photoresist 62 from the structure can be achieved utilizing a conventional resist stripping process such as, for example, ashing.

Figure 18:
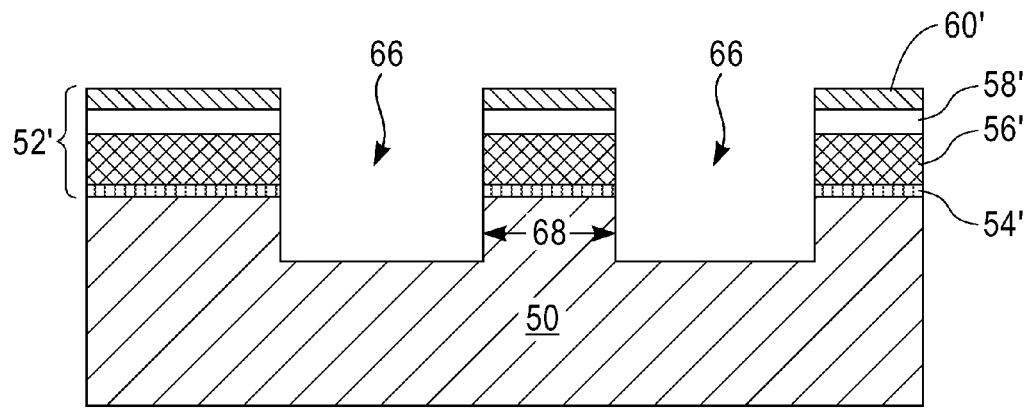
FIG. 18 is a vertical-cross sectional view illustrating the structure of FIG. 17 after forming a trench within the semiconductor substrate utilizing the patterned material stack as an etch mask.

Referring to FIG. 18, there is illustrated the structure of FIG. 16 after forming a trench 66 within the semiconductor substrate 50 utilizing the patterned material stack 52' as an etch mask. That is, FIG. 18 shows the resultant structure that is formed after transferring the pattern of the opening 64 into an upper portion of the semiconductor substrate 50. In one embodiment, the trench 66 is formed by an isotropic etch. The anisotropic etch etches the semiconductor material of the semiconductor substrate 50 selective to the various materials of the patterned material stack 52'.

The trench 66 that is formed into the upper portion of the semiconductor substrate 50 replicates the pattern of the opening 64 that is present in the patterned material stack 52'. In one embodiment, the trench 66 can be a line trench. Each trench 66 has a depth d as measured from the upper surface of the semiconductor substrate 50 to the bottommost surface of the trench 66.

In one embodiment, a first trench and a second trench are laterally separated by a lateral distance ld through the patterned material stack 52' and the upper portion of the semiconductor substrate 50. A portion of the semiconductor substrate 50 between the two trenches 66 has a width, which is the lateral distance ld between the two trenches 66. This portion of the semiconductor substrate 50 is herein referred to as a laterally isolated semiconductor material portion 68. In one embodiment, the lateral distance ld, i.e., the width of the laterally isolated semiconductor material portion 68, is less than the depth d of the two trenches 66. Each of the two trenches 66 laterally separates the laterally isolated semiconductor material portion 68 from the rest of the semiconductor substrate 50.

Each trench 66 can have a same first width w1, or a different first width w1 that varies from one trench to another trench. The first width w1 of each trench 66 can be, for example, in a range from 50 nm to 5,000 nm.

Figure 19:
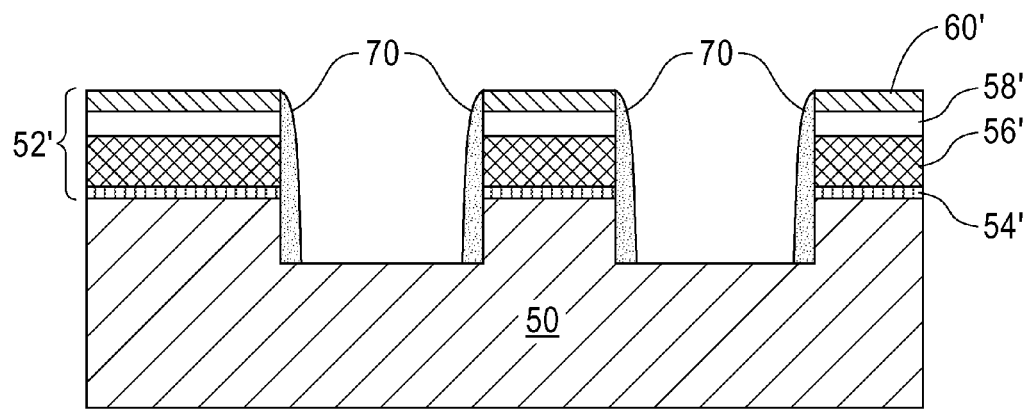
FIG. 19 is a vertical-cross sectional view illustrating the structure of FIG. 18 after forming a sacrificial nitride-containing spacer within the trench and along exposed sidewalls of the semiconductor substrate and the patterned material stack.

Referring to FIG. 19, there is illustrated the structure of FIG. 18 after forming a sacrificial nitride-containing spacer 70 within each trench 66 and along exposed sidewalls of the semiconductor substrate 50 and the patterned material stack 52'. Each sacrificial nitride-containing spacer 70 that is formed has a base that is located on an exposed portion of the semiconductor substrate 10 within trench 66. Each sacrificial nitride-containing spacer 70 can be comprised of a semiconductor nitride, such as, for example, silicon nitride, or a dielectric metallic nitride. Each sacrificial nitride-containing spacer 70 can be formed by deposition and etching.

Figure 20:
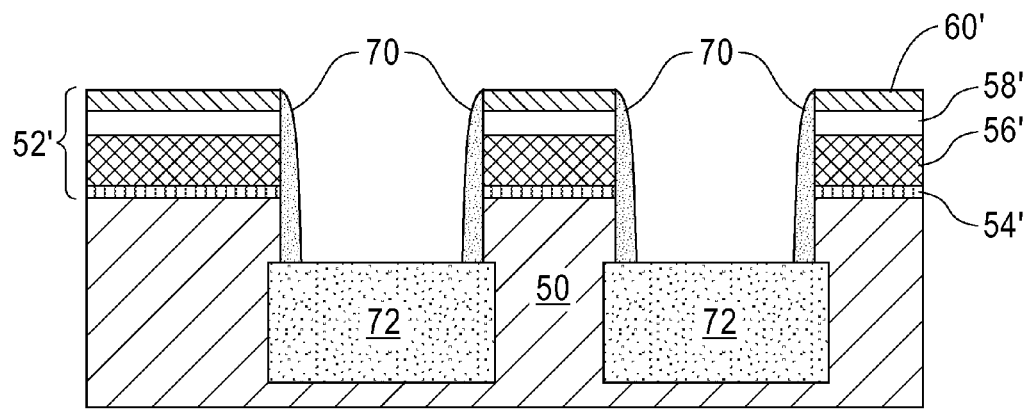
FIG. 20 is a vertical-cross sectional view illustrating the structure of FIG. 19 after oxidizing exposed portions of the semiconductor substrate within the trench and not protected by the sacrificial nitride-containing spacer.

Referring now to FIG. 20, there is illustrated the structure of FIG. 19 after oxidizing exposed portions of the semiconductor substrate 50 within a bottom portion of each trench 66 and not protected by the sacrificial nitride-containing spacer 70. The oxidizing forms a semiconductor oxide region 72 within the exposed portion of the semiconductor substrate 50 defined by trenches 66. Semiconductor oxide region 72 can also be referred to herein as a BOX region. The oxidizing comprises a thermal oxidation process which is performed at a temperature which is capable of converting the exposed portions of semiconductor substrate 50 into a semiconductor oxide material. In one embodiment, the temperature of the oxidizing is from 900° C. to 1100° C.

Each semiconductor oxide region 72 that is formed at this point of the present disclosure has a width that is equal to or greater than the width of the corresponding trench 66. The depth that each semiconductor oxide region 72 extends from the exposed surfaces of the semiconductor substrate 50 defined by the trenches 66 various depending on the conditions of the oxidizing process.

Figure 21:
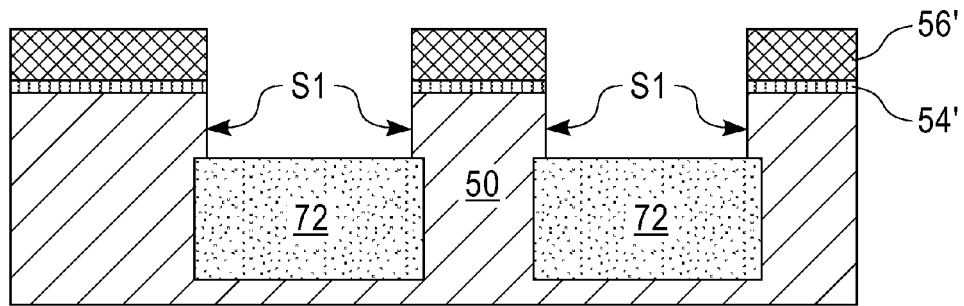
FIG. 21 is a vertical-cross sectional view illustrating the structure of FIG. 20 after removing the sacrificial nitride-containing spacer and an upper portion of the patterned material stack.

Referring to FIG. 21, there is illustrated the structure of FIG. 20 after removing the sacrificial nitride-containing spacer 70 from each trench 66 and an upper portion of the patterned material stack 52' including the remaining portions of the second oxygen-impermeable layer 60' and the remaining portion of the second pad oxide 58'. The removal of the sacrificial nitride-containing spacer 70 can be performed utilizing a chemical wet etch process that selectively removes the sacrificial nitride-containing spacer 70 relative to oxide material. During this removal, the remaining portions of the second oxygen-impermeable layer 60' are also removed. The remaining portion of the second pad oxide 58' is removed by a planarization process, such as, for example chemical mechanical polishing and/or grinding. This planarization process stops on an uppermost surface of the remaining portion of the first oxygen-impermeable layer 56'. As shown, sidewall surface S1 of the semiconductor substrate 50 are exposed after removing the sacrificial nitride-containing spacer 70 from the structure.

Figure 22:
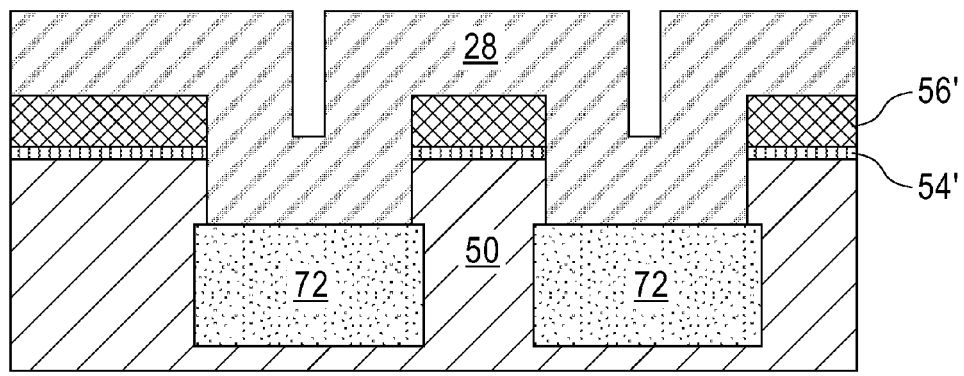
FIG. 22 is a vertical-cross sectional view illustrating the structure of FIG. 21 after forming a non-single crystalline semiconductor layer on an exposed surface of the patterned material stack and all exposed surfaces within the at least one trench.

Referring to FIG. 22, there is illustrated the structure of FIG. 21 after forming a non-single crystalline semiconductor layer 28 on an exposed surface of the remaining patterned material stack (i.e., layer 56') and all exposed surfaces within the at least one trench. The non-single crystalline semiconductor layer 28 of this embodiment includes one of the semiconductor materials mentioned above in the other embodiment of the present disclosure. Also, the non-single crystalline semiconductor layer 28 of this embodiment can be formed utilizing one of the conformal deposition process mentioned in the other embodiment of the present disclosure.

Figure 23:
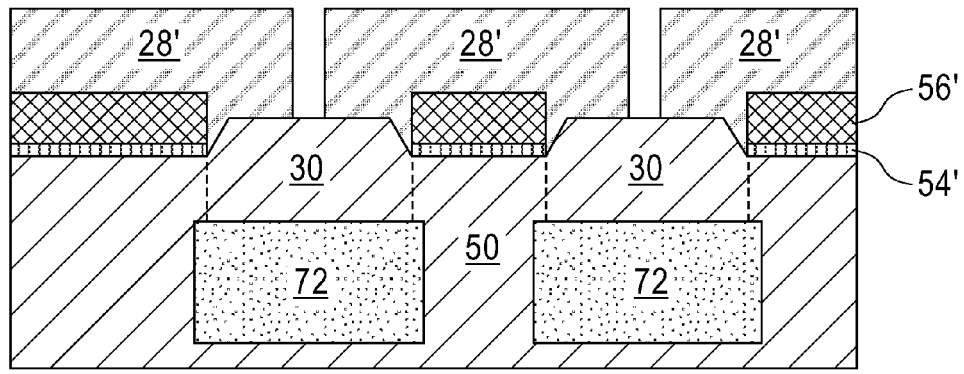
FIG. 23 is a vertical-cross sectional view illustrating the structure of FIG. 22 after performing solid state crystallization in which a bottom portion of said non-single crystalline semiconductor layer in contact with sidewall surfaces of the semiconductor substrate is converted into a crystalline semiconductor layer.

Referring now to FIG. 23, there is illustrated the structure of FIG. 22 after performing a solid state crystallization in which a bottom portion of the non-single crystalline semiconductor layer 28 that is in contact with sidewall surfaces S1 of the semiconductor substrate 10 is converted into a crystalline semiconductor layer 30. The details concerning the solid state crystallization described above are also applicable here for this embodiment of the present disclosure and thus are incorporated herein by reference. In FIG. 23, reference numeral 28' denotes portions of the non-single crystalline semiconductor layer 28 that are not crystallized during the solid state crystallization process of the present disclosure.

Figure 24:
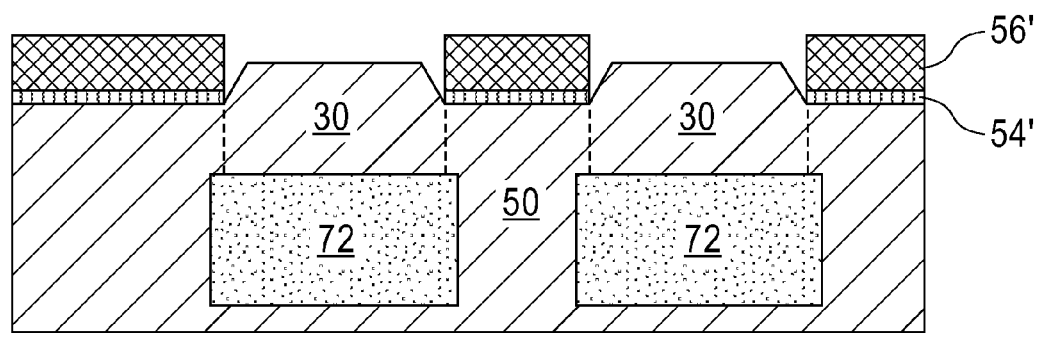
FIG. 24 is a vertical-cross sectional view illustrating the structure of FIG. 23 after removing remaining non-single crystalline semiconductor portions from atop the semiconductor substrate.

Referring now to FIG. 24, there is illustrated the structure of FIG. 23 after removing remaining non-single crystalline semiconductor portions 28' from atop the semiconductor substrate 10. The removal of the non-single crystalline semiconductor portions 28' of this embodiment of the present disclosure is the same as that described above in regard to FIG. 9 of the other embodiment of the present disclosure.

Figure 25:
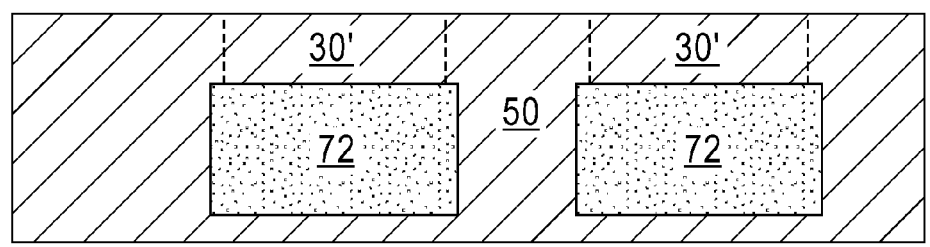
FIG. 25 is a vertical-cross sectional view illustrating the structure of FIG. 24 after removing the patterned material stack from atop the semiconductor substrate and performing a planarization process.

Referring now to FIG. 25 there is illustrated the structure of FIG. 24 after removing the remaining lower portions of the patterned material stack (including the remaining portions of the first oxygen-impermeable layer 56' and the remaining portions of the first pad oxide 54') from atop the semiconductor substrate 50. Also, a portion of the crystalline semiconductor layer 30 that is located between the remaining portions of the first oxygen-impermeable layer 56' and the remaining portions of the first pad oxide 54' can, in some embodiments, be concurrently removed at this point of the present process. The remaining portion of the crystalline semiconductor layer 30 that is located between the physically exposed sidewall surfaces of the semiconductor substrate 50 and above each semiconductor oxide region 72 can be referred to herein as a photonic SOI layer 30'.

In some embodiments of the present disclosure, the remaining lower portions of the patterned material stack (i.e., the remaining portions of the first oxygen-impermeable layer 56' and the remaining portions of the first pad oxide 54') and the portion of the crystalline semiconductor layer 30 between adjacent patterned material stack portions can be removed in a single step utilizing, for example, by planarization. The single step planarization process can include, for example, chemical mechanical polishing and/or grinding. In other embodiments, the remaining portions of the patterned material stack (i.e., the remaining portions of the first oxygen-impermeable layer 56' and the remaining portions of the first pad oxide 54') can be removed prior to removing the portion of the crystalline semiconductor layer 30. In such an embodiment, one or more dry etching and/or chemical wet etching processes can be used to the remaining portions of the patterned material stack (i.e., the remaining portions of the first oxygen-impermeable layer 56' and the remaining portions of the first pad oxide 54'), followed by chemical mechanical polishing which removes the portion of the crystalline semiconductor layer 30 that was previously located between adjacent patterned material stack portions.

The resultant structure illustrated, for example, in FIG. 25, is planar. That is, an uppermost surface of the photonic SOI layer 30' is coplanar to the upper surface of the semiconductor substrate 50. At this point of the present disclosure, isolation trenches and bulk semiconductor devices can be formed. The processes used in forming the isolation trenches and bulk semiconductor devices can include the same processing as mentioned above in FIGS. 11-14 of the present disclosure.

The methods of the present disclosure have advantages over prior art (such, as is disclosed, for example, in H-C. Ji et al, 7th IEEE International Conference on Group IV Photonics (GFP), pp. 96-98, September 2010). For example, the methods of the present disclosure use a small crystalline semiconductor window (or area) as a seed for re-crystallization instead of using the whole bulk semiconductor substrate. As such, low pattern factor and relatively small and uniform features used for re-crystallization are provided that minimize defect density and result in higher quality photonics SOI without affecting the bulk semiconductor used to fabricate other devices, such as CMOS.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:

provinding a patterned material stack having at least one opening on an upper surface of a semiconductor substrate;

forming at least one trench within the semiconductor substrate utilizing said patterned material stack as an etch mask;

filling said at least one trench and said at least opening with an oxide;

recessing said oxide below said upper surface of said semiconductor substrate to expose sidewall surfaces of said semiconductor substrate within said at least one trench;

forming a non-crystalline semiconductor layer atop said patterned material stack and within said at least one trench, wherein at least one portion the non-crystalline semiconductor layer directly contacts said exposed sidewalls of said semiconductor substrate;

performing solid state crystallization, wherein said at least one portion of the non-crystalline semiconductor layer that directly contacts said exposed sidewalls of said semiconductor substrate is crystallized to form a localized SOI layer;

removing remaining non-crystalline semiconductor layer portions;

forming a plurality of isolation trenches within said semiconductor substrate, wherein a first isolation trench is formed through a portion of said localized SOI layer and exposes a topmost surface and a first sidewall surface of a remaining oxide portion, and a second isolation trench is formed directly adjacent a second sidewall surface of said remaining oxide portion and a remaining portion of said localized SOI layer;

filling each isolation trench with a dielectric oxide, wherein said dielectric oxide in said first isolation trench directly contacts a topmost surface and said first sidewall surface of said remaining oxide portion, and wherein said dielectric oxide in said first trench and said second trench has a bottommost surface that is coplanar with a bottommost surface of said remaining oxide portion; and forming a bulk semiconductor device directly on an exposed surface of said semiconductor substrate, wherein said exposed surface of said semiconductor substrate and said bulk semiconductor device are separated from said remaining portion of said localized SOI layer by said second isolation trench.

2. The method of claim 1, wherein said providing the patterned material stack comprises:

forming a pad oxide on the upper surface of the semiconductor substrate;

forming an oxygen-impermeable layer on an exposed surface of said pad oxide;

forming a photoresist material on an exposed surface of said oxygen-impermeable layer;

patterning said photoresist material by lithography; and transferring a pattern from said photoresist material into said oxygen-impermeable layer and said pad oxide.

3. The method of claim 1, wherein said forming said at least one trench comprises forming a pair of trenches within said semiconductor substrate, wherein a first trench of said pair of trenches is separated from a second trench of said pair of trenches by a laterally isolation semiconductor material portion of said semiconductor substrate.

4. The method of claim 1, wherein said filling said at least one trench and said at least opening with said oxide comprises a deposition process.

5. The method of claim 1, wherein said recessing said oxide comprises a timed controlled reactive ion etch.

6. The method of claim 1, wherein forming said non-crystalline semiconductor material comprises a conformal deposition process.

7. The method of claim 6, wherein said non-crystalline semiconductor material comprises amorphous silicon.

8. The method of claim 6, wherein said non-crystalline semiconductor material comprises polysilicon.

9. The method of claim 1, said performing said solid state crystallization comprises thermal annealing.

10. The method of claim 9, wherein said thermal anneal is performed at a temperature from 500° C. to 1400° C.

11. The method of claim 1, further comprising removing the patterned material stack present above the upper surface of the semiconductor substrate.

12. The method of claim 1, wherein said remaining portion of said localized SOI layer has a width that is less than a width of said localizes SOI layer prior to forming said isolation trenches.

* * * * *